United States Patent
Kent et al.

(10) Patent No.: US 9,236,103 B2
(45) Date of Patent: *Jan. 12, 2016

(54) BIPOLAR SPIN-TRANSFER SWITCHING

(71) Applicant: New York University, New York, NY (US)

(72) Inventors: Andrew Kent, New York, NY (US); Daniel Bedau, New York, NY (US); Huanlong Liu, New York, NY (US)

(73) Assignee: New York University, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/264,685

(22) Filed: Apr. 29, 2014

(65) Prior Publication Data

US 2014/0233306 A1   Aug. 21, 2014

Related U.S. Application Data

(60) Continuation of application No. 13/298,190, filed on Nov. 16, 2011, now Pat. No. 8,755,222, and a continuation-in-part of application No. 13/041,104, filed on Mar. 4, 2011, now Pat. No. 8,363,465, which (Continued)

(51) Int. Cl.
*G11C 11/14* (2006.01)
*G11C 11/16* (2006.01)
(Continued)

(52) U.S. Cl.
CPC ........... *G11C 11/161* (2013.01); *G11C 11/16* (2013.01); *G11C 11/5607* (2013.01); *H01L 27/222* (2013.01); *H01L 29/66984* (2013.01)

(58) Field of Classification Search
CPC ........... H01L 27/222; H01L 29/66984; H01L 45/1233; G11C 11/161; G11C 11/16; G11C 11/155
USPC ........................... 365/171, 173, 158, 131, 130
See application file for complete search history.

(56) References Cited

U.S. PATENT DOCUMENTS

| 5,541,868 A | 7/1996 | Prinz |
| 5,541,888 A | 7/1996 | Russell |

(Continued)

FOREIGN PATENT DOCUMENTS

| CA | 2766141 | 1/2011 |
| EP | 1 345 277 A1 | 9/2003 |

(Continued)

OTHER PUBLICATIONS

Ingvarsson, S., et al., "Tunable magnetization damping in transition metal ternary alloys", Applied Physics Letters, vol. 85, No. 21, Nov. 22, 2004., pp. 4995-4997.

(Continued)

*Primary Examiner* — Fernando Hidalgo
(74) *Attorney, Agent, or Firm* — Foley & Lardner LLP

(57) ABSTRACT

A magnetic device includes a magnetized polarizing layer, a free magnetic layer, and a reference layer. The free magnetic layer forms a first electrode and is separated from the magnetized polarizing layer by a first non-magnetic metal layer. The free magnetic layer has a magnetization vector having a first and second stable state. The reference layer forms a second electrode and is separated from the free-magnetic layer by a second non-magnetic layer. Unipolar current is sourced through the polarizing, free magnetic and reference layers. Switching of the magnetization vector of the free magnetic layer from the first stable state to the second state is initiated by application of a first unipolar current pulse, and switching of the magnetization vector of the free magnetic layer from the second stable state to the first stable state is initiated by application of a second unipolar current pulse.

17 Claims, 13 Drawing Sheets

Related U.S. Application Data is a division of application No. 12/490,588, filed on Jun. 24, 2009, now Pat. No. 7,911,832, which is a continuation-in-part of application No. 11/932,745, filed on Oct. 31, 2007, now Pat. No. 7,573,737, which is a continuation-in-part of application No. 11/498,303, filed on Aug. 1, 2006, now Pat. No. 7,307,876, which is a continuation-in-part of application No. 11/250,791, filed on Oct. 13, 2005, now Pat. No. 7,170,778, which is a continuation of application No. 10/643,762, filed on Aug. 19, 2003, now Pat. No. 6,980,469.

(60) Provisional application No. 61/414,724, filed on Nov. 17, 2010.

(51) Int. Cl.
   *G11C 11/56* (2006.01)
   *H01L 27/22* (2006.01)
   *H01L 29/66* (2006.01)

(56) References Cited

U.S. PATENT DOCUMENTS

| | | |
|---|---|---|
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,796 B1 | 6/2001 | Lenssen et al. |
| 6,252,798 B1 | 6/2001 | Satoh et al. |
| 6,256,223 B1 | 7/2001 | Sun |
| 6,272,036 B1 | 8/2001 | You et al. |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,603,677 B2 | 8/2003 | Redon et al. |
| 6,653,154 B2 | 11/2003 | Doan et al. |
| 6,654,278 B1 | 11/2003 | Engel et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,773,515 B2 | 8/2004 | Li et al. |
| 6,777,730 B2 | 8/2004 | Daughton et al. |
| 6,812,537 B2 | 11/2004 | Okazawa et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,009,877 B1 | 3/2006 | Huai et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,573,737 B2 | 8/2009 | Kent |
| 7,911,832 B2 | 3/2011 | Kent |
| 8,279,666 B2 | 10/2012 | Dieny et al. |
| 8,363,465 B2 | 1/2013 | Kent |
| 8,755,222 B2 * | 6/2014 | Kent et al. .............. 365/171 |
| 2002/0090533 A1 | 7/2002 | Zhang et al. |
| 2002/0105823 A1 | 8/2002 | Redon et al. |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0094785 A1 | 5/2004 | Zhu et al. |
| 2004/0130936 A1 | 7/2004 | Nguyen et al. |
| 2005/0041342 A1 | 2/2005 | Huai et al. |
| 2005/0041462 A1 | 2/2005 | Kent et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0242501 A1 | 10/2007 | Hung et al. |
| 2008/0112094 A1 | 5/2008 | Kent et al. |
| 2008/0151614 A1 | 6/2008 | Guo |
| 2008/0297292 A1 | 12/2008 | Viala et al. |
| 2009/0072185 A1 | 3/2009 | Raksha et al. |
| 2009/0098413 A1 | 4/2009 | Kanegae |
| 2009/0141540 A1 | 6/2009 | Miura et al. |
| 2009/0296462 A1 | 12/2009 | Kent et al. |
| 2010/0027870 A1 | 2/2010 | Rodrigues et al. |
| 2010/0124091 A1 | 5/2010 | Cowburn |
| 2010/0140726 A1 | 6/2010 | Apalkov et al. |
| 2010/0195380 A1 | 8/2010 | Wang et al. |
| 2010/0226169 A1 | 9/2010 | Gao et al. |
| 2010/0271870 A1 | 10/2010 | Zheng et al. |
| 2011/0007560 A1 | 1/2011 | Dieny et al. |
| 2011/0141791 A1 | 6/2011 | Ahmed |
| 2012/0069649 A1 | 3/2012 | Ranjan et al. |
| 2012/0261776 A1 | 10/2012 | Tang et al. |
| 2013/0075845 A1 | 3/2013 | Chen et al. |
| 2014/0008742 A1 | 1/2014 | Chen et al. |

FOREIGN PATENT DOCUMENTS

| | | |
|---|---|---|
| EP | 2 182 532 | 5/2010 |
| FR | 2817998 | 6/2002 |
| FR | 2832542 | 5/2003 |
| FR | 2910716 | 6/2008 |
| JP | 10-004012 A | 1/1998 |

(56) References Cited

FOREIGN PATENT DOCUMENTS

| | | |
|---|---|---|
| JP | 11-120758 | 4/1999 |
| JP | 11-353867 | 12/1999 |
| JP | 2001-195878 A | 7/2001 |
| JP | 2002-261352 | 9/2002 |
| JP | 2002-357489 | 12/2002 |
| JP | 2003-318461 | 11/2003 |
| JP | 2005-150482 | 6/2005 |
| JP | 2005-535111 | 11/2005 |
| JP | 2006-128579 | 5/2006 |
| JP | 2007-525005 | 8/2007 |
| JP | 2008-177421 | 7/2008 |
| JP | 2008-524830 | 7/2008 |
| JP | 2008-524830 A | 7/2008 |
| JP | 2009-027177 | 2/2009 |
| JP | 2010-109372 | 5/2010 |
| WO | WO2005/020251 | 3/2005 |
| WO | WO-2009/059071 | 5/2009 |
| WO | WO-2009/080636 | 7/2009 |

OTHER PUBLICATIONS

Office Action for Canada App. No. 2,535,965, dated Dec. 12, 2014, 3 pages.
Notification of Provisional Rejection for Korean App. No. 10-2010-7011550, dated Dec. 10, 2014, 6 pages.
Notification of Reasons of Refusal for Japanese App. No. 2013-257366, dated Dec. 3, 2014, 3 pages.
First Office Action (with English Translation) in Japanese Patent Application No. 2006-524031, dated May 10, 2011, (8 pgs.).
Lee et al., Analytical investigation of spin-transfer dynamics using a perpendicular-to-plane polarizer., Applied Physics Letters, 86, pp. 022505-022505-3, 2005.
Martens et al., "Magnetic Reversal in nanoscopic Ferromagnetic Rings", NSF grants PHY-0351964 (DLS), 2006, 23 pages.
Martens et al., "Thermally Induced Magnetic Switching in Thin Ferromagnetic Annuli", NSF grants PHY-0351964 (DLS), 2005, 11 pages.
Non-Final Office Action for U.S. Appl. No. 13/298,190, dated Jul. 2, 2013, (20 pgs.).
Non-Final Office Action on U.S. Appl. No. 13/720,290, dated May 14, 2013, (20 pgs.).
Notice of Allowance for U.S. Appl. No. 13/720,290, mailed Sep. 12, 2013.
Notice of Allowance on U.S. Appl. No. 12/490,588, dated Feb. 3, 2011, (11 pgs.).
Notice of Allowance on U.S. Appl. No. 13/041,104, dated Sep. 21, 2012, (7pgs.).
Notice of Reasons for Rejection received for JP 2012-043157 dated Sep. 3, 2013.
Notification of Provisional Rejection received for Korean Appln. No. 10-2012-7001872 mailed Jun. 5, 2013.
Notification of Reasons for Refusal received in Japanese Appln. No. 2012-517632 dated Jul. 17, 2013.
Office Action for Canadian Application No. 2,766,141, dated Sep. 4, 2013, 4 pages.
Office Action issued by the Chinese Patent Office, Oct. 29, 2012, Chinese Application No. 200880119942.4, 10 pages.
Office Action on U.S. Appl. No. 13/041,104, dated Apr. 6, 2012, (17 pgs.).
Office Action received for JP 2010-531338 dated Jun. 18, 2013.
PCT International Search Report and Written Opinion on Int'l. Application No. PCT/US2010/039373, dated Jan. 5, 2011, (5 pgs.).
Supplementary European Search Report received for EP 10797550.0 completed Jul. 22, 2013 and mailed Sep. 16, 2013.
US Notice of Allowance on DTD Sep. 30, 2013.
Decision of Rejection dated Mar. 18, 2014 for Japanese App. No. 2012-043157, 5 pages.
Firastrau et al., "Spin-torque nano-oscillator based on a synthetic antiferromagnet free layer and perpendicular to plane polarizer", J. App. Phys. 113, 113908 (2013).
Stiles et al., "Spin-Transfer Torque and Dynamic", Spin Dynamics in Confined Magnetic Structures III, Topics in Applied Physics vol. 101, pp. 225-308 (206).
Office Action dated May 13, 2014, for U.S. Appl. No. 13/919,466, 20 pages.
Second Notification of Provisional Rejection for Korean Patent Application No. 10-2012-7001872, dated Dec. 30, 2013, 37 pages.
Notification of the Third Office Action for Chinese App. No. 200880119942.4 dated Dec. 16, 2013, 5 pages.
Notification of Provisional Rejection for Korean App. No. 10-2013-7023576 dated Oct. 30, 2013, 46 pages.
Notice of Allowance for U.S. Appl. No. 13/298,190 dated Oct. 28, 2013, 8 pages.
Petition for Inter Partes Review of U.S. Pat. No. 6,980,469, IPR2014-00047, dated Oct. 10, 2013, 62 pages.
Declaration of Sanjay K. Banerjee, Ph.D., Inter Partes Review of U.S. Pat. No. 6,980,469, IPR2014-00047, dated Oct. 9, 2013, 288 pages.
Observations by a third party concerning patentability in European App. No. 04781554.3 dated Dec. 13, 2013, 3 pages.
New York University's Patent Owner Preliminary Response, IPR2014-00047, dated Jan. 17, 2014, 59 pages.
Office Action for Canadian application No. 2,766,141 dated May 22, 2014, 3 pages.
Notice of Reasons for Rejection dated Jul. 22, 2014 for Japanese App. No. 2013-539989, 14 pages.
European Search Report dated Jul. 24, 2014 for EP App. No. 11841445.7, 9 pages.
Notification of Provisional Rejection for Korean App. No. 10-2013-7015305, dated Aug. 29, 2014, 4 pages.
Notification of the First Office Action for Chinese App. No. 201180063255.7, dated Oct. 30, 2014, 3 pages.
Chinese 2nd Office Action for Appl. No. 201180063255.7; dated Apr. 3, 2015, 9 pages.
European Extended Search Report for Application No. 14198308.0, dated Apr. 8, 2015, 4 pages.
Japanese Final Office Action for Appl. No. 2013-257366, Dated Mar. 30, 2015, 3 pages.
Japanese Final Office Action for Appl. No. 2013-539989, Dated Apr. 6, 2015, 9 pages.
Korean Office Action for Appl. No. 10-2013-7015305 with English summary, mailed May 29, 2015, 4 pages.
Notification of Reasons for Refusal in Japanese Patent Application No. 2013-257367, dated Feb. 12, 2015 with English Translation, 6 pages.
US Notice of Allowance for U.S. Appl. No. 13/298,190, mailed Feb. 7, 2014, 6 pages.
US Notice of Allowance for U.S. Appl. No. 13/720,290, dated Feb. 7, 2014, 6 pages.
US Notice of Allowance for U.S. Appl. No. 13/720,290, mailed Oct. 25, 2013, 10 pages.
Chinese 3rd Office Action for Appl. No. 201180063255.7 English translation, dated Jun. 17, 2015, 4 pages.
US 7,026,672, 04/2006, Pakala et al. (withdrawn)

* cited by examiner

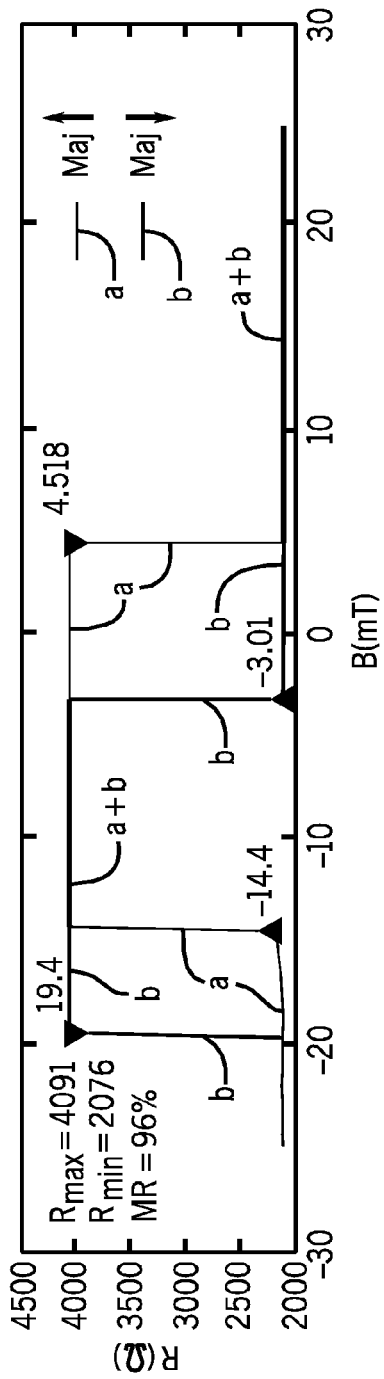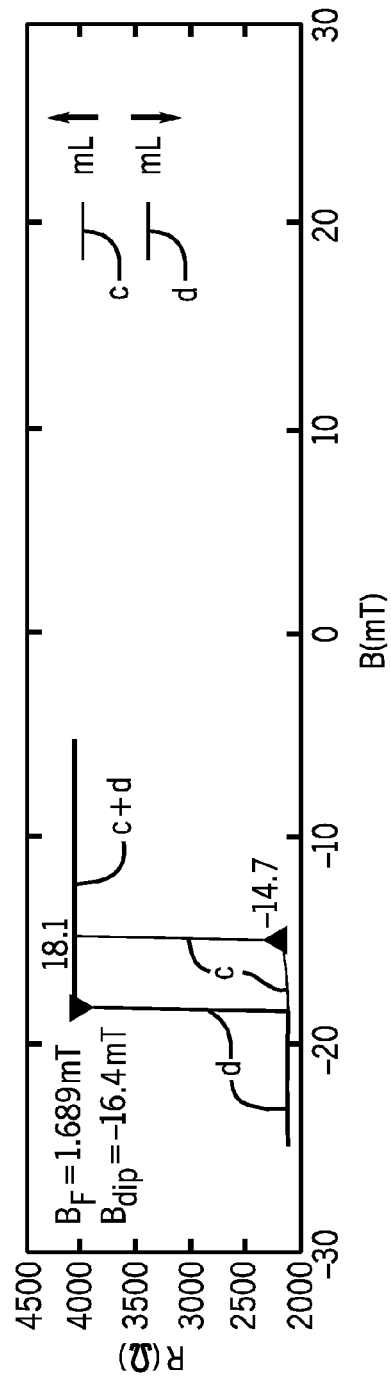
FIG. 7(a)
FIG. 7(b)

BIPOLAR SPIN-TRANSFER SWITCHING

CROSS-REFERENCE TO RELATED PATENT APPLICATIONS

This application is a continuation of U.S. patent application Ser. No. 13/298,190, filed Nov. 16, 2011, which claims the benefit of U.S. Provisional Application No. 61/414,724 filed Nov. 17, 2010. 13/298,190 is also a continuation-in-part of U.S. patent application Ser. No. 13/041,104, filed Mar. 4, 2011, now U.S. Pat. No. 8,363,465, which is a divisional application of U.S. patent application Ser. No. 12/490,588, filed Jun. 24, 2009, now U.S. Pat. No. 7,911,832. U.S. patent application Ser. No. 12/490,588, is a continuation in part of Ser. No. 11/932,745, filed Oct. 31, 2007 now U.S. Pat. No. 7,573,737, which is a continuation in part of U.S. patent application Ser. No. 11/498,303, filed Aug. 1, 2006, now U.S. Pat. No. 7,307,876, which is a continuation in part of U.S. patent application Ser. No. 11/250,791, filed Oct. 13, 2005, now U.S. Pat. No. 7,170,778, which is a continuation of U.S. patent application Ser. No. 10/643,762, filed Aug. 19, 2003, now U.S. Pat. No. 6,980,469. All of these applications are incorporated herein by reference in their entirety.

FIELD OF THE INVENTION

The present invention generally relates to magnetic devices such as used for memory and information processing. More particularly the invention describes a spin-transfer torque magnetic random access memory (STT-MRAM) providing for bipolar spin-transfer switching.

BACKGROUND OF THE INVENTION

Magnetic devices that use a flow of spin-polarized electrons are of interest for magnetic memory and information processing applications. Such a device generally includes at least two ferromagnetic electrodes that are separated by a non-magnetic material, such as a metal or insulator. The thicknesses of the electrodes are typically in the range of 1 nm to 50 nm. If the non-magnetic material is a metal, then this type of device is known as a giant magnetoresistance or spin-valve device. The resistance of the device depends on the relative magnetization orientation of the magnetic electrodes, such as whether they are oriented parallel or anti-parallel (i.e., the magnetizations lie on parallel lines but point in opposite directions). One electrode typically has its magnetization pinned, i.e., it has a higher coercivity than the other electrode 50 and requires larger magnetic fields or spin-polarized currents to change the orientation of its magnetization. The second layer is known as the free electrode and its magnetization direction can be changed relative to the former. Information can be stored in the orientation of this second layer. For example, "1" or "0" can be represented by anti-parallel alignment of the layers and "0" or "1" by parallel alignment. The device resistance will be different for these two states and thus the device resistance can be used to distinguish "1" from "0." An important feature of such a device is that it is a non-volatile memory, since the device maintains the information even tens of nanometers when the power is off, like a magnetic hard drive. The magnet electrodes can be sub-micron in lateral size and the magnetization direction can still be stable with respect to thermal fluctuations.

In conventional magnetic random access memory (MRAM) designs, magnetic fields are used to switch the magnetization direction of the free electrode. These magnetic fields are produced using current carrying wires near the magnetic electrodes. The wires must be small in cross-section because memory devices consist of dense arrays of MRAM cells. As the magnetic fields from the wires generate long-range magnetic fields (magnetic fields decay only as the inverse of the distance from the center of the wire) there will be cross-talk between elements of the arrays, and one device will experience the magnetic fields from the other devices. This cross-talk will limit the density of the memory and/or cause errors in memory operations. Further, the magnetic fields generated by such wires are limited to about 0.1 Tesla at the position of the electrodes, which leads to slow device operation. Importantly, conventional memory designs also use stochastic (random) processes or fluctuating fields to initiate the switching events, which is inherently slow and unreliable (see, for example, R. H. Koch et al., Phys. Rev. Lett. 84, 5419(2000)).

In U.S. Pat. No. 5,695,864 and several other publications (e.g., J. Slonckewski, Journal of Magnetism and Magnetic Materials 159, LI (1996)), John Slonckewski described a mechanism by which a spin-polarized current can be used to directly change the magnetic orientation of a magnetic electrode. In the proposed mechanism, the spin angular momentum of the flowing electrons interacts directly with the background magnetization of a magnetic region. The moving electrons transfer a portion of their spin-angular momentum to the background magnetization and produce a torque on the magnetization in this region. This torque can alter the direction of magnetization of this region and switch its magnetization direction. Further, this interaction is local, since it only acts on regions through which the current flows. However, the proposed mechanism was purely theoretical.

Spin-transfer torque magnetic random access memory (STT-MRAM) devices hold great promise as a universal memory. STT-MRAM is non-volatile, has a small cell size, high endurance and may match the speed of static RAM (SRAM). A disadvantage of the common collinearly magnetized STT-MRAM devices is that they often have long mean switching times and broad switching time distributions. This is associated with the fact that the spin-torque is non-zero only when the layer magnetizations are misaligned. Spin transfer switching thus requires an initial misalignment of the switchable magnetic (free) layer, e.g. from a thermal fluctuation. Relying on thermal fluctuations leads to incoherent reversal with an unpredictable incubation delay, which can be several nanoseconds.

Spin-transfer torque magnetic random access memory (STT-MRAM) devices use current or voltage pulses to change the magnetic state of an element to write information. In all STT-MRAM devices known to date, voltage/current pulses of both positive and negative polarities are needed for device operation. For example, positive pulses are needed to write a "1" and negative polarity pulses are needed to write a "0". (Of course, the definition of which magnetic state represents a "1" and which a "0" is arbitrary.) This magnetic element typically has two possible states, magnetization oriented either "left" or "right", parallel or antiparallel to the magnetization of a reference layer in the device. These two magnetic states have different resistances, which can be used to read-out the information electrically.

Using present complementary metal-oxide-semiconductor (CMOS) technology, circuitry is needed to control the signals to STT-MRAM cells. Prior STT-MRAM devices required bipolar sources and the bit cells were set to one state by one polarity and the other state by the other polarity, i.e. unipolar That is, the source needed to be able to provide both polarities because each polarity only could write either "0" or "1".

Although reading can be done with a unipolar voltage/current source, writing information required a bipolar source.

SUMMARY OF THE INVENTION

In view of the limitations associated with conventional designs of devices using spin transfer torque, an object of the present invention is to provide a structure and methods that provide an improved magnetic memory or magnetic information processing device.

It is another object of the invention to produce a magnetic device requiring simplified external drive circuitry.

It is another object of the invention to produce a magnetic device that has advantages in terms of speed of operation.

It is another object of the invention to produce a magnetic device that has advantages in terms of reliability.

It is another object of the invention to produce a magnetic device that consumes less power.

These and other additional objects of the invention are accomplished by a device and methods that employ magnetic layers in which the layer magnetization directions do not lie along the same axis. For instance, in one embodiment, two magnetic regions have magnetizations that are orthogonal.

A further aspect of the invention provides a magnetic device that does not require a specific polarity of pulse. The magnetic device has at least a first stable state and a second stable state. The application of a pulse of appropriate amplitude and duration will switch the magnetic device from whatever its current state is to the other state, i.e. from the first state to the second state or the second state to the first state. Thus, the pulse source need only be unipolar and the bit cell is bipolar in that it can accept a pulse of either polarity.

BRIEF DESCRIPTION OF THE DRAWINGS

The forgoing and other features of the present invention will be more readily apparent from the following detailed description and drawings of the illustrative embodiments of the invention wherein like reference numbers refer to similar elements through the views and in which:

FIG. 4(b) AP to P state wherein the switching is bipolar, occurring for both positive and negative pulse polarities;

FIGS. 7(a)-7(c) illustrate typical device characteristics for a 50 nm×115 nm ellipse shaped bit cell; the resistance is measured as a function of applied in-plane magnetic field; FIG. 7(a) shows the applied field induced switching of the reference and free layers; FIG. 7(b) shows the applied field induced switching of just the reference layer and FIG. 7(c) shows the applied field induced switching of just the free layer;

DETAILED DESCRIPTION OF THE PREFERRED EMBODIMENTS

Figure 1A:
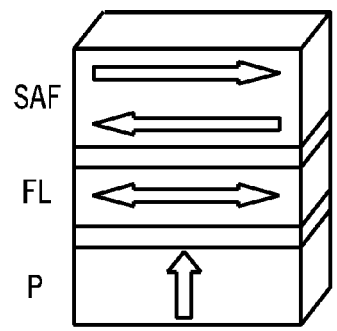
FIG. 1(a) illustrates a OST-MRAM layer stack.

The present invention is directed to orthogonal spin transfer MRAM (OST-MRAM) devices and methods. OST-MRAM employs a spin-polarizing layer magnetized perpendicularly to a free layer to achieve large initial spin-transfer torques. This geometry has significant advantages over collinear magnetized STT-MRAM devices as it eliminates the nanosecond incubation delay and reduces the stochastic nature of the switching. It also has the potential for write times below 50 ps. FIG. 1(a) illustrates one embodiment of a STT-MRAM. A perpendicularly magnetized polarizer (P) is separated by a non-magnetic metal from the free magnetic layer (FL). The free layer forms one electrode of a MTJ. The other electrode, the reference layer, consists of an SAF free layer.

In OST-MRAM the reference magnetic layer is used to read out the magnetic state. The magnetization of this layer is set to be collinear to that of the free layer and the memory states correspond to the free layer magnetization parallel (P) or antiparallel (AP) to the reference layer magnetization. Previous OST-MRAM devices utilized an out-of-plane magnetized spin-polarizer was combined with an in-plane magnetized spin-valve. While fast switching was seen, the resulting read-out signals were small; there was less than ~5% magnetoresistance (MR). The device impedance was also small, ~5 Ω.

One embodiment of the present invention is directed to a magnetic tunnel junction (MTJ) based OST-MRAM device that combines fast switching and large (>100%) MR, both of which are critical for applications. The device impedance is ~1 kΩ and thus compatible with complementary metal-oxide-semiconductor (CMOS) field effect transistor (FET) memory control circuitry. The write function switches the state of the cell, rather than setting the state. Further, the switching is bipolar, occurring for positive and negative polarity pulses, consistent with a precessional reversal mechanism.

In one embodiment, the present invention provides apparatus and methods enabling a "toggle" mode of spin-transfer device operation. The pulse source may be unipolar because the bit cell does not set the state based upon the polarity of the pulse, i.e. it is bipolar. Rather a pulse of sufficient amplitude for either polarity will "toggle" the magnetic state of the device, "1"→"0" and "0"→"1". Thus, a pulse (of sufficient time and amplitude) will change the magnetic state of the device or bit cell, irrespective of the original magnetic state. As such, in one embodiment, the writing of information in such a "toggle" mode of operation may require reading the device or bit cell initial state and either applying or not applying a current/voltage pulse depending on the information to be written. That is, if the device or bit cell was already in the desired state no pulse would be applied.

Figure 2:
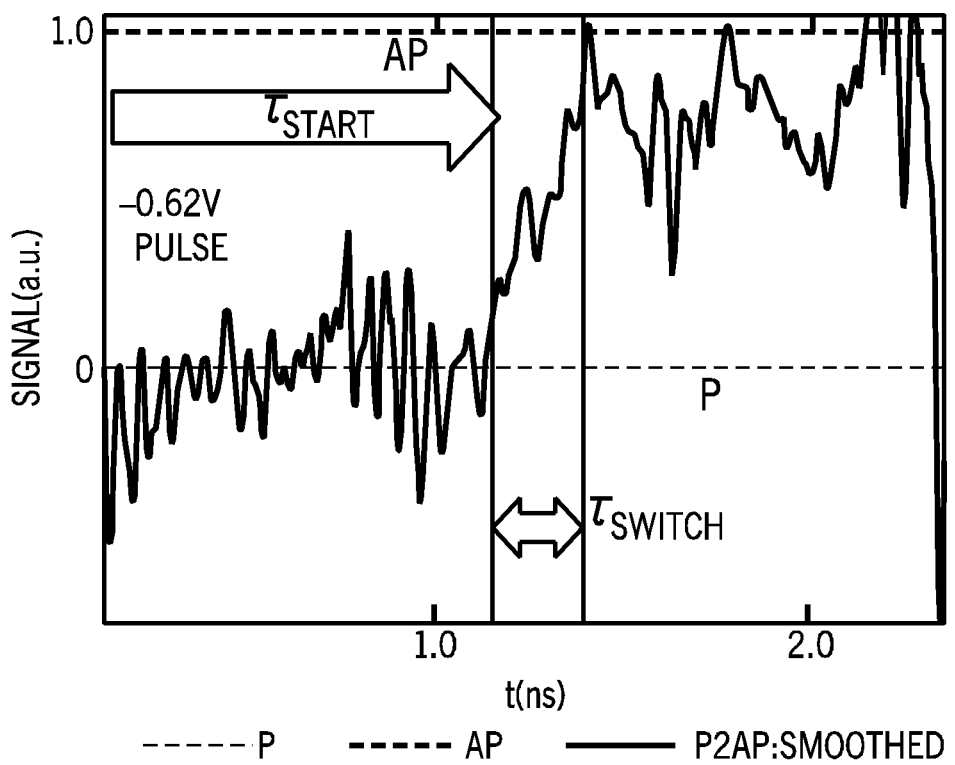
FIG. 2 is an example of precessional switching and illustrates a pulse for producing magnetization precession.

As an example of this embodiment, FIG. 2 illustrates an experimental time resolved voltage trace of a bit cell switching event. A voltage pulse of −0.62 V is applied for about 2 ns, starting at time zero in the plot. The device is a 50 nm×115 nm ellipse shaped bit cell and has an impedance of about 2 kOhm. The horizontal dashed trace at the signal level of 1 corresponds to the antiparallel state (AP). The horizontal dashed trace at signal level 0 shows the response when the bit cell is in the parallel (P) state. (P and AP refer to the magnetization direction of the free layer with respect to the reference layer magnetization in the stack.) At about 1.1 ns the device switches from the P to the AP state. The device then precesses at a frequency of about 3 GHz. The device final state (P or AP) depends in the pulse duration.

The use of a bipolar toggle for STT-MRAM allows the external drive circuitry to be simplified because all device operations (i.e., reading and writing) can be accomplished with a power source of one polarity. In addition, it is believed that devices utilizing the present invention will likely operate faster because pulses of less than 500 psec will toggle the magnetic state of the device. An additional benefit of the need for only one polarity is that power consumption will be reduced. This is due, in part, to the fact that the supply voltages to the device do not need to be switched between different levels. In present MRAM-CMOS designs, typically one transistor is associated with each MRAM bit cell and the source and drain voltages on this transistor need to be varied to write the information. In accordance with one embodiment of the present invention, the source or drain voltages may be maintained at constant levels. Maintaining the source or drain voltages at a constant level(s) reduces the power required for device operation, as each time the polarity of a supply voltage is changed energy is required. In one embodiment, switching requires an energy of less than 450 fJ in a free magnetic layer that is thermally stable at room temperature.

As previously mentioned hereinbefore, one characteristic of the described OST-MRAM devices is that the switching is bipolar, i.e. a bit cell in accordance with the present invention may be switched between states using either voltage pulse polarity. However, there can be thresholds for the pulse to trigger a switch. Those thresholds may differ depending on the pulse, for example depending on the pulse polarity or depending on the device initial state, i.e. P or AP. This characteristic is illustrated further below regarding the examples in FIGS. 4(a) and 4(b).

Figure 4A:
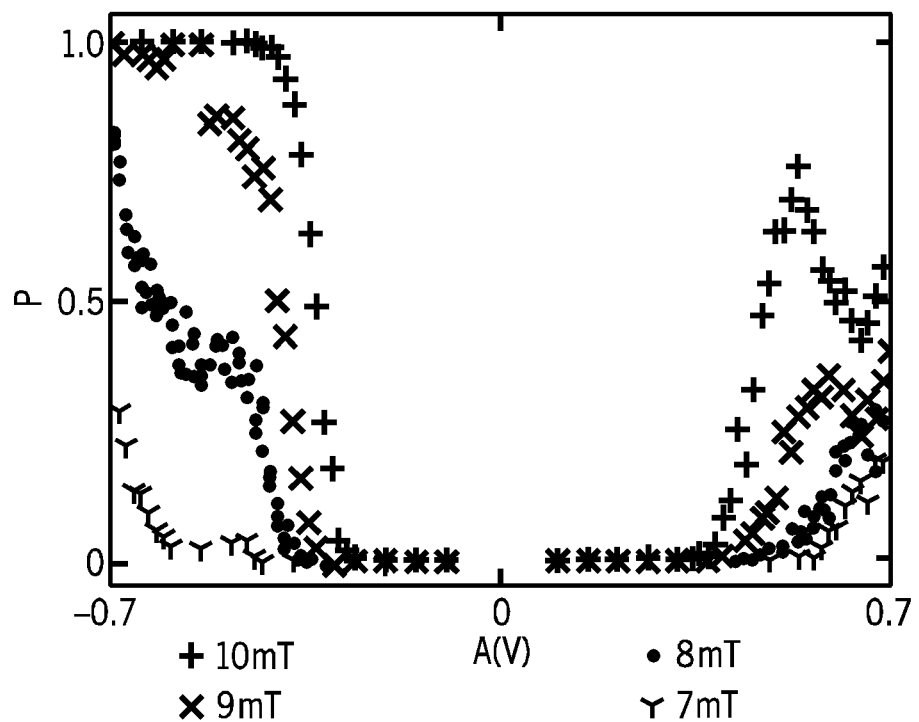
FIGS. 4(a) and 4(b) are graphs of switching probability as a function of pulse amplitude at a fixed pulse duration of 700 ps with FIG. 4(a) P to AP state.
Figure 4B:
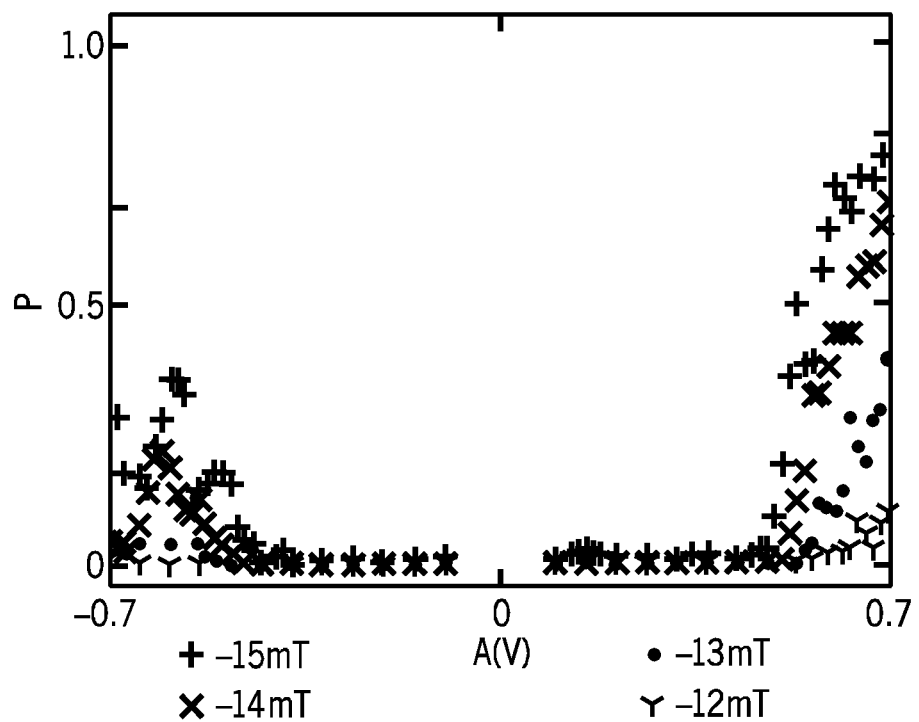

This asymmetry in the probability distribution for the two polarities is distinct from the characteristics seen in common collinear free layer/tunnel barrier/SAF type STT devices. In these devices switching only occurs for one polarity of the voltage pulse, or through thermally induced backhopping. As previously stated, in OST-MRAM devices switching occurs for both polarities. This bipolar switching process is an indication that the torque originates from the perpendicular polarizer. For a collinear device we would expect P→AP switching only for positive polarity pulses, based on spin-transfer torque models. For one embodiment of the invention, a positive polarity pulse leads to a lower switching probability (FIG. 4(a)) compared to the opposite polarity pulse. If the switching processes involved simple heating of the junction, rather than the spin-transfer torque switching in the OST-MRAM device as described herein, it would be expected that a symmetric switching probability distribution and a monotonic dependence of the switching probability on pulse amplitude would be observed, which is not the case as seen in FIGS. 4(a) and 4(b).

Figure 5:
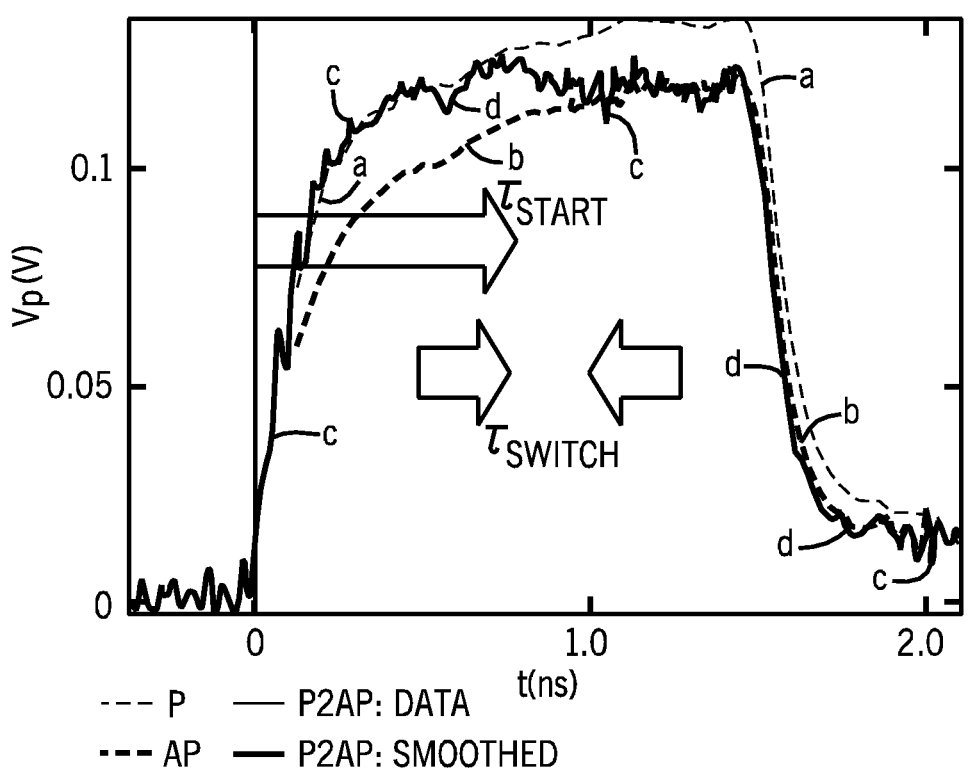
FIG. 5 is an example of direct switching and shows a voltage trace of a bit cell switching event.
Figure 6A:
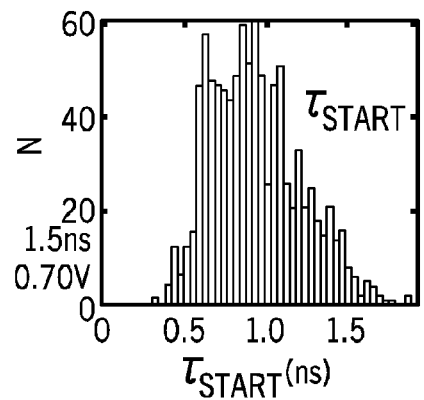
FIGS. 6(a)-6(f) illustrate the statistical probability from P to AP as a function of the pulse amplitude; larger pulse amplitudes produce shorter switching start times and shorter times to switch.
Figure 6D:
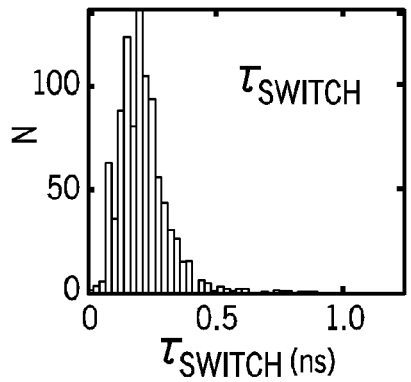
Figure 6B:
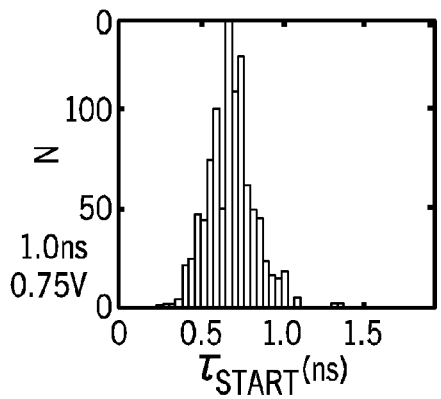
Figure 6E:
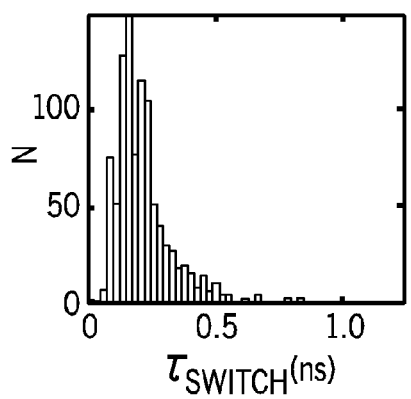
Figure 6C:
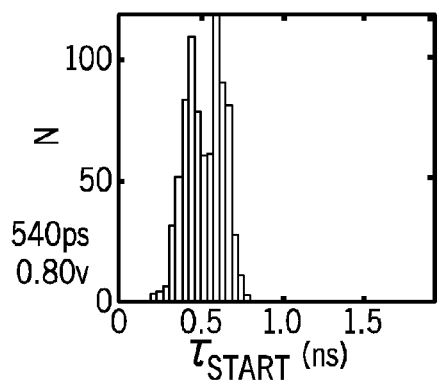
Figure 6F:
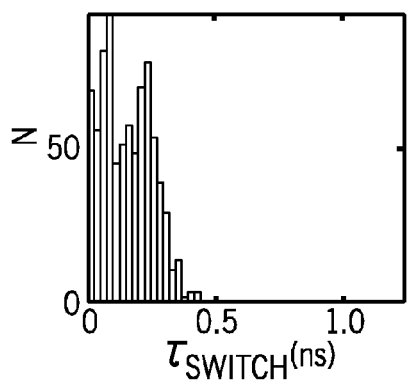

As an example of this embodiment, FIG. 5 illustrates an experimental time resolved voltage trace of a bit cell switching event. A voltage pulse of 0.7 V is applied for about 2 ns, starting at time zero in the plot. The device is a 60×180 nm² shaped hexagon and has an impedance of order of 1 kOhm. The dotted line trace "a" shows the response when the bit cell is in the parallel state (P). The line trace "b" shows the response when the bit cell is in the antiparallel (AP) state. (P and AP refer the magnetization direction of the free layer with respect to the reference layer magnetization in the stack.) The line trace "c" shows an event in which the device switches from P to AP about 1.2 ns after the start of the pulse. The line trace "d" shows the same data filtered to remove the high frequency components, which is associated with noise. The start time and switching time are defined as indicated in this FIG. 5.

The free layer magnetization rotation about its demagnetizing field will result in a switching probability that is a nonmonotonic function of the pulse amplitude or duration, because if the pulse ends after the free layer magnetization finishes a full rotation (i.e., a $2\pi$ rotation), the probability of switching will be reduced. The precession frequency can also be a function of the pulse polarity due to the fringe fields from the polarizing and reference layers. Further, spin-torques from the reference layer break the symmetry of the reversal by adding torques that favor one free layer state over another.

Thus, a device in accordance with the principles of the present invention can utilize voltage/current pulses of just one polarity to write both "0" and "1" states. A device initially in the "1" state can be switched to a "0" state and a device originally in the state "0" can be switched into the state "1" with the same polarity pulse. Further, although the pulse amplitudes needed for these operations can differ (see FIGS. 4(a) and 4(b)), this aspect can be used to advantage in device operation. For example, if the thresholds differ then the pulse amplitude can uniquely determine the device final state. In one embodiment, the differences between the thresholds for a positive polarity pulse and a negative polarity pulse can be significant enough that a read step would be unnecessary. For example, where a negative pulse requires a much lower amplitude and or pulse duration to achieve a 100% probability of a switch from P to AP than the positive pulse and vice versa, the positive pulse requires a much lower amplitude or pulse duration to achieve 100% probability of a switch from AP to P, those thresholds can be utilized to achieve a desired functionality. If the positive pulse that is necessary to switch from AP to P would be below the threshold necessary to switch from P to AP and vice versa for the negative pulse, then a device need not read the bit cell prior to a write. For example, where a write of the bit cell to P state is desired, the device can be pulsed with a sufficient (above the 100% threshold for switching to P but below that threshold for a switch to AP) positive pulse. If the bit cell is in AP, the positive pulse is sufficient to switch to P. However, if the bit cell is already in P, the positive pulse would be insufficient (i.e. below the threshold) to switch to AP.

The following non-limiting Examples illustrate various attributes of the invention.

EXAMPLE 1

Figure 1B:
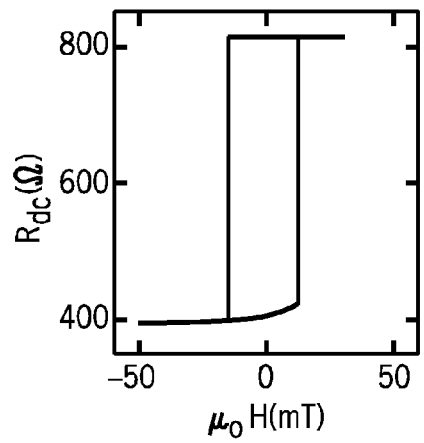
FIG. 1(b) is a graph of device resistance vs. in-plane field showing 107% magnetoresistance (MR) and the switching of the free layer from the parallel (P) to antiparallel (AP) state at 12 mT and AP to P state at −16 mT. 1.
Figure 1C:
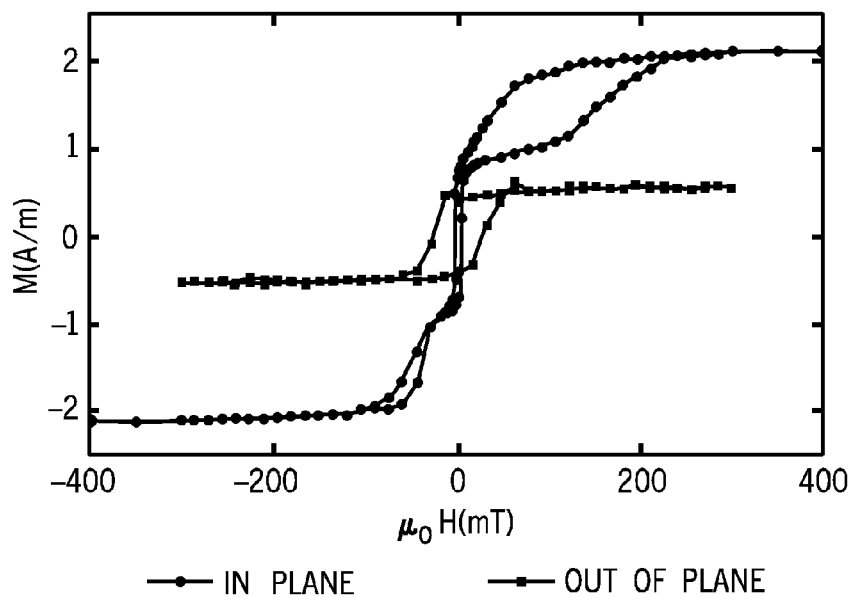
FIG. 1(c) is a graph of device vibrating sample magnetometry (VSM) measurements of the magnetization of the layer stack wherein the dotted line curve shows the switching of the free layer and (synthetic antiferramagnetic) (SAF) free layer under an in-plane applied field and the squared line red curve shows the characteristics of the polarizing layer, under a field perpendicular to the plane, demonstrating the high remanence and a coercive field of 50 mT.

The OST-MRAM layer stack was grown on 150 mm oxidized silicon wafers using a Singulus TIMARIS PVD module. The device layer structure is illustrated in FIG. 1(a). The polarizer consists of a Co/Pd multilayer exchange coupled to a Co/Ni multilayer. The Co/Ni multilayer has a high spin polarization due to the strong spin-scattering asymmetry of Co in Ni and a perpendicular magnetic anisotropy (PMA). To enhance the layer coercivity and remanence this layer is coupled to Co/Pd which has a very large PMA but a lower spin polarization due to the strong spin-orbit scattering by Pd. The polarizer is separated by 10 nm of Cu from an in-plane magnetized CoFeB free layer that is one of the electrodes of a MTJ. The MTJ structure is 3 CoFeB|0.8 MgO|2.3 $Co_{0.4}Fe_{0.4}B_{0.2}$|0.6 Ru|2 $Co_{0.4}Fe_{0.3}$ 16 PtMn (number to the left of each composition indicates the layer thicknesses in nm). The wafer was annealed at 300° C. for 2 hours in a magnetic field and then characterized by vibrating sample magnetometry (VSM), ferromagnetic resonance spectroscopy (FMR), and current-in-plane-tunneling (CIPT) measurements. FIG. 1(c) shows VSM measurements of the film magnetization for in-plane and perpendicular-to-the-plane applied fields. The free layer is very soft while the reference layer has a coercive field of about 50 mT; the exchange bias from the antiferromagnetic PtMn is 100 mT. The perpendicular polarizer has a coercive field of 50 mT.

The wafers were patterned to create OST-MRAM devices using e-beam and optical lithography. Ion-milling was used to etch sub-100 nm features through the free layer. Device sizes varied from 40 nm×80 nm to 80 nm×240 nm in the form of rectangles, ellipses and hexagons. Approximately 100 junctions were studied. Set forth in greater detail below are results obtained on one 60 nm×180 nm hexagon shaped device. Although not presented here, similar results have been obtained on other devices of this type.

The sample resistance was measured by applying a small voltage ($V_{dc}$, =30 mV) and measuring the current. The MR of the device is mainly determined by the relative orientation of the free (3 CoFeB) and reference (2.3 CoFeB) layers, which can be either parallel (PA) or antiparallel (AP). FIG. 1(b) shows the minor hysteresis loop of the free layer. The patterned free layer has a coercive field of 14 mT at room temperature and the device has 107% MR. The loop is centered at about −2 mT, due to a small residual dipolar coupling from the synthetic antiferromagnetic (SAF) reference layer.

To measure the current-induced switching probability, pulses of variable amplitude, duration and polarity were applied. An applied field was used to set the sample into the bistable region (see FIG. 1(b)) and then voltage pulses were applied, using a pulse generator that provides up to 2 V amplitude with a minimum pulse duration of 50 ps. By measuring the resistance using a small dc voltage before and after the pulse, we can determine the device state. Since the free layer is very stable without any applied voltage (see the discussion below), it can be assumed that a switching event (i.e., dynamics of the free layer magnetization to a point at which the free layer magnetization would reverse in the absence of the pulse) occurred during the voltage pulse. In this setup, positive voltage is defined to correspond to electrons flowing from the bottom to the top of the layer stack, i.e. from the polarizer toward the free and reference layers.

Figure 3:
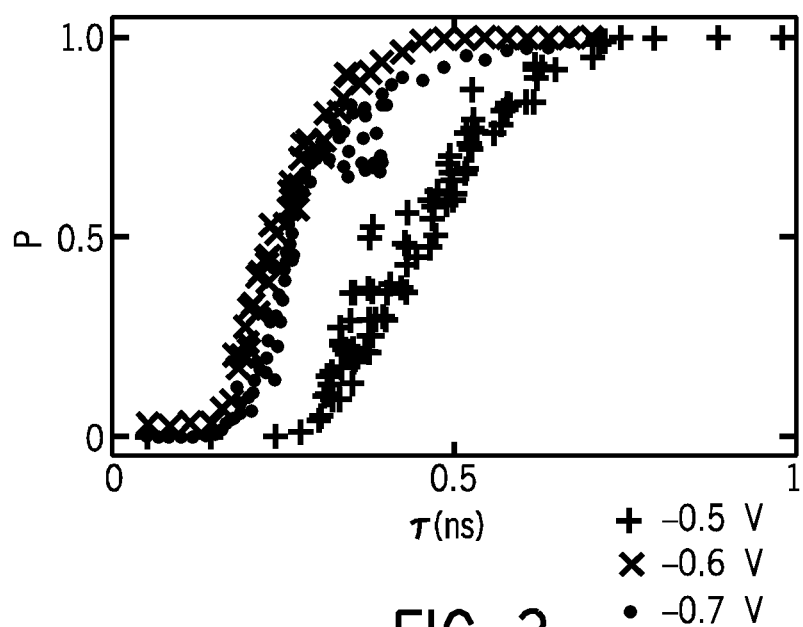
FIG. 3 is a graph of the switching probability from the P to the AP state as a function of pulse duration for three different pulse amplitudes at an applied field of 10 mT. 100% switching probability is achieved for pulses of less than 500 ps duration.

Both amplitude and pulse duration where observed to impact the probability of a switching event. FIG. 3 shows the switching probability from the P to the AP state as a function of pulse duration in an applied field of 10 mT for three different pulse amplitudes, −0.5, −0.6 and −0.7 V. Higher amplitude pulses lead to switching at shorter pulse durations. It has been observed that a device in accordance with the present invention can be switched with pulses less than 500 ps in duration with 100% probability. The energy needed for 100% probability switching is less than 450 fJ. As 100% switching probability was observed for pulses as short as 500 ps, it is believed that there is no incubation delay of several nanoseconds as observed in conventional collinear or nearly collinearly magnetized devices. The switching process of the present invention thus provides both fast and predictable results.

To determine the energy barrier of the reversal, the coercive field of the sample is measured at different field sweep rates. The energy barrier is then determined from the relation:

$$\tau = \tau_0 \exp\left[\xi_0\left(1 - \frac{H_{app}}{H_c}\right)^\beta\right], \quad (1)$$

where $\xi_0 = U_0/kT$, the zero applied field energy barrier over the thermal energy, with T=300 K. Assuming $\beta$=2, we obtain an energy barrier of $\xi$=40 at $\mu_0 H_{app}$=0.01 T, indicating the layer is very thermally stable at room temperature.

As previously mentioned, one characteristic of the described OST-MRAM devices is that the switching is bipolar, i.e. a bit cell in accordance with the present invention may be switched between states using either voltage pulse polarity. For the examples described above, FIG. 4(a) shows the switching probability versus pulse amplitude for (a) P→AP switching and FIG. 4(b) shows AP→P switching at a pulse duration of 700 ps. Although the OST-MRAM device is bipolar, it can be seen in FIG. 4(a) that negative polarity pulses lead to higher switching probability than positive polarity pulses. The opposite is found in FIG. 4(b) for AP→P. In both cases applied fields closer to the coercive field lead to a lower voltage pulse threshold for switching. Also the switching probability is a nonmonotonic function of the pulse amplitude. The observed data is qualitatively consistent with precessional reversal being driven by the perpendicular polarizer.

EXAMPLE 2

The magnetization dynamics of the device and method in the preferred embodiment can be modeled to a first approximation by considering the spin transfer torques associated with the perpendicular polarizer and the reference layer as follows:

$$\frac{d\hat{m}}{dt} = \qquad (2)$$

$$-\gamma\mu_0 \hat{m} \times \vec{H}_{eff} + \alpha\hat{m} \times \frac{d\hat{m}}{dt} + \gamma a_J \hat{m} \times (\hat{m} \times \hat{m}_P) - \beta\gamma a_J \hat{m} \times (\hat{m} \times \hat{m}_R)$$

where m represents the magnetization direction of the free layer (it is a unit vector in the direction of the free layer magnetization). $\alpha$ is the damping parameter of the free layer. The prefactor, $a_J$, depends on the current density J, the spin-polarization P of the current density J, and the cosine of the angle between the free and pinned magnetic layers, cos(θ), such that $\alpha_J = \hbar J g(P, \cos(\theta))/(eMt)$. The $\hbar$ is the reduced Planck's constant, g is a function of the spin-polarization P and cos(θ), M is the magnetization density of the free layer, e is the charge of an electron, and t is the thickness of the free layer. The last two terms are the spin transfer from the perpendicular polarizer ($m_P$) and the in-plane magnetized reference layer ($m_R$). The β (beta) represents the ratio of the magnitude of these two torques.

Figure 7C:
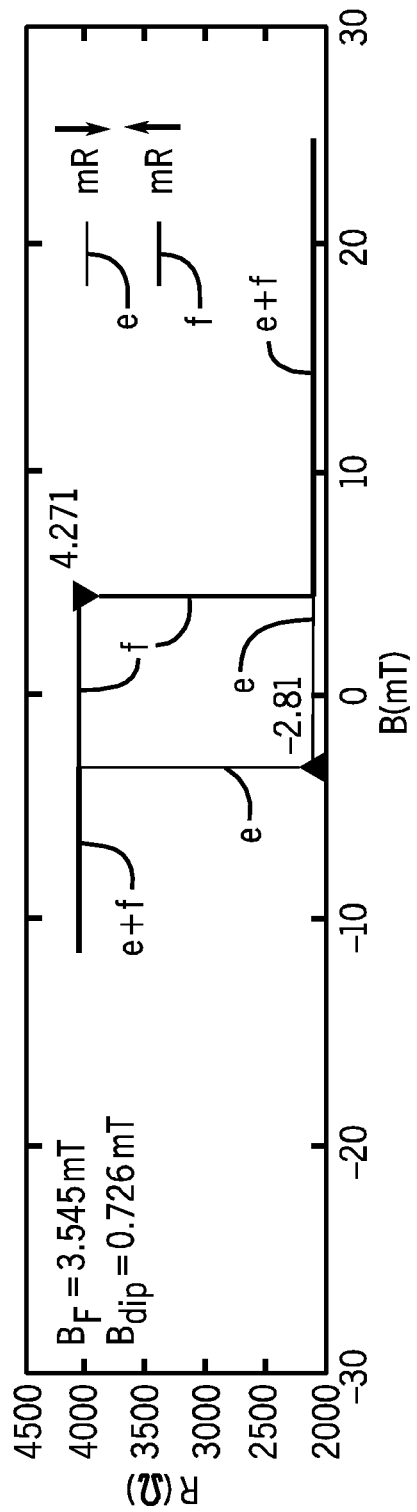
Figure 8A:
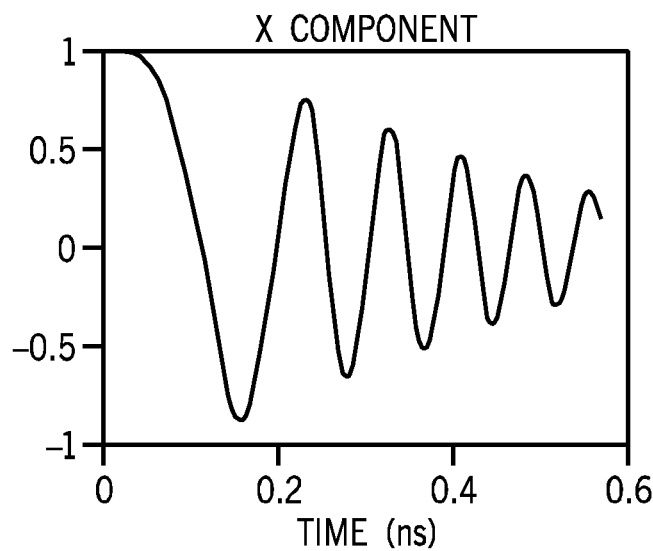
FIGS. 8(a)-8(c) show for conditions ($\beta=1$, $a_j=+0.025$) the magnetization switching is precessional, starting at time zero from a P state; the three components of the magnetization are show, $m_x$, $m_y$ and $m_z$.
Figure 8B:
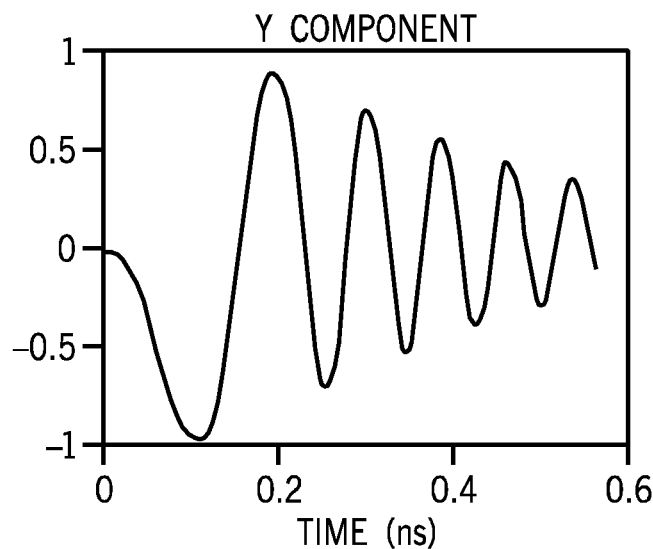
Figure 8C:
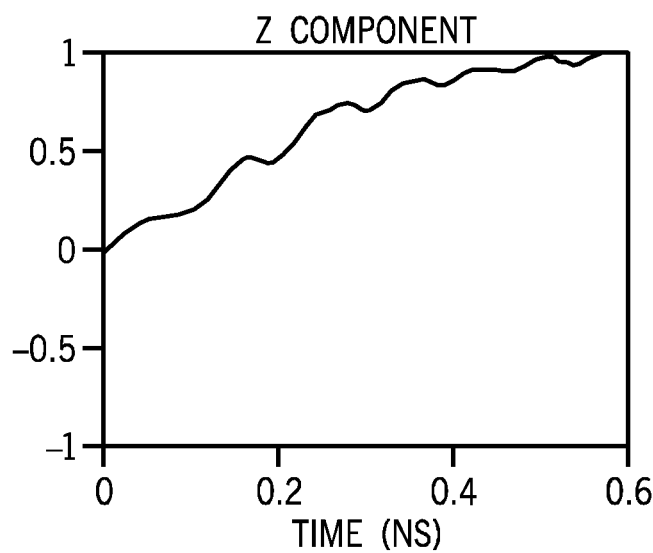
Figure 9A:
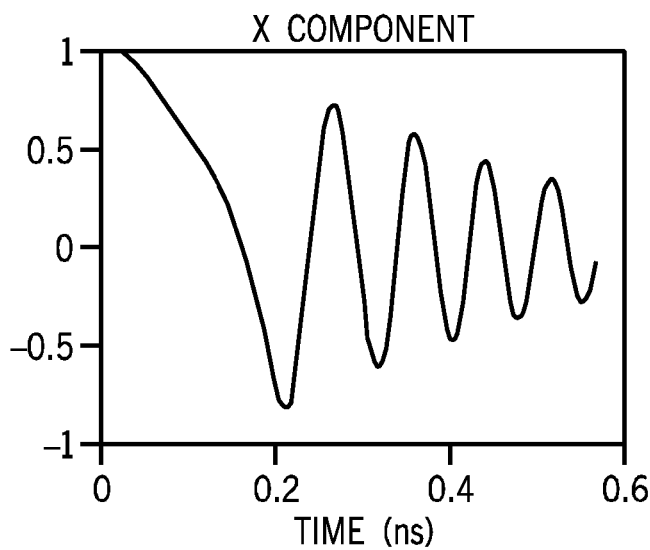
FIGS. 9(a)-9(c) show for conditions ($\beta=1$, $a_j=-0.025$) the magnetization switching is precessional, this shows that both positive and negative polarity pulses lead to precessional magnetization reversal, with somewhat different rates (or frequencies) of precession.
Figure 9B:
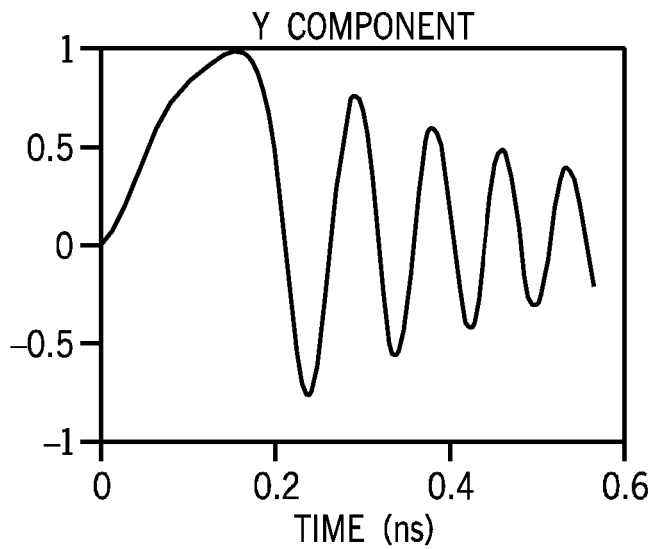
Figure 9C:
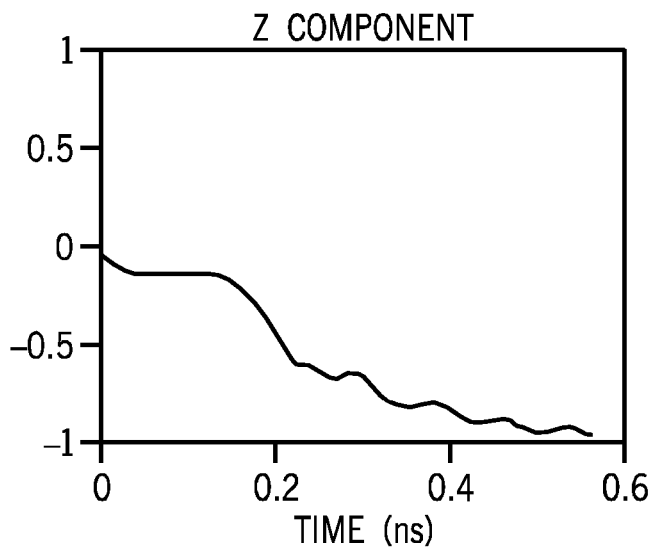
Figure 10A:
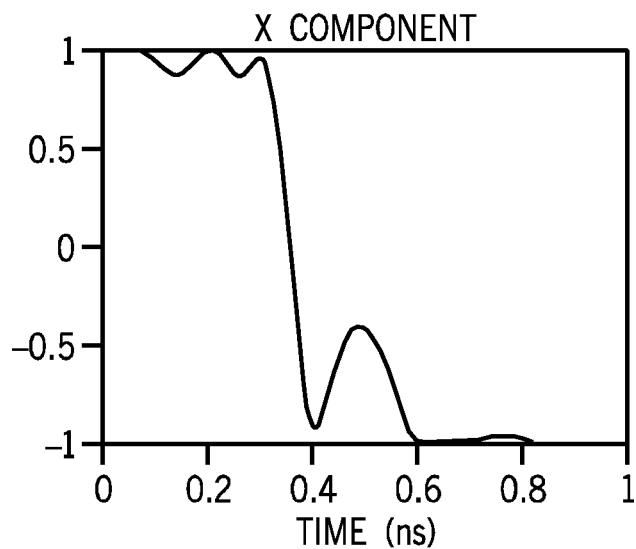
FIG. 10(a)-10(c) show for conditions ($\beta=5$, $a_j=+0.008$) the magnetization switching from P to AP is direct (i.e. there is no precession)
Figure 10B:
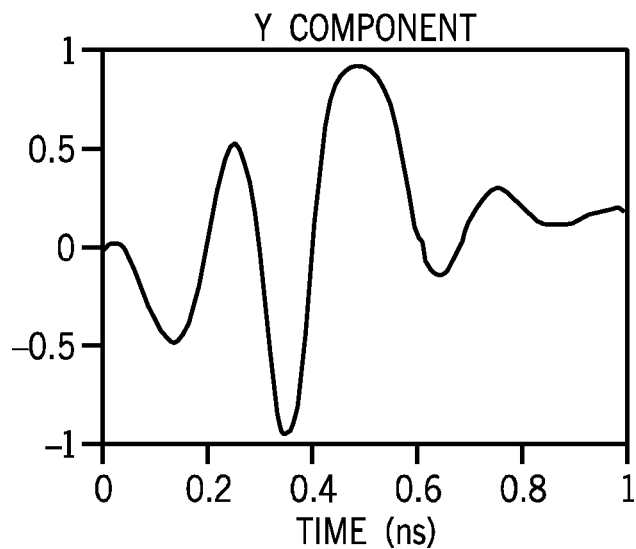
Figure 10C:
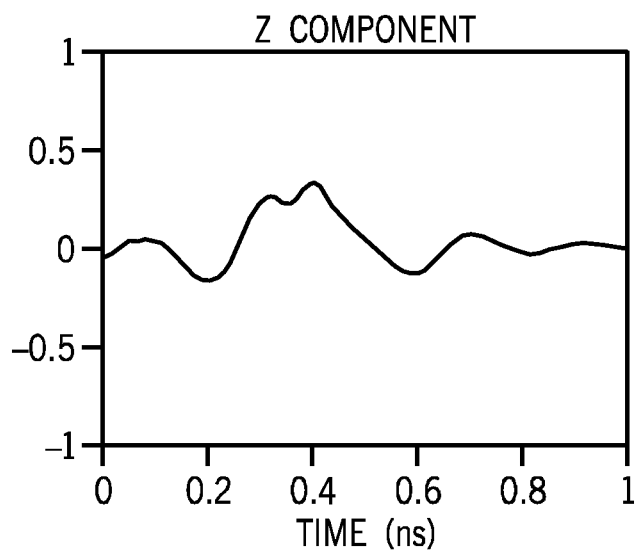
Figure 11A:
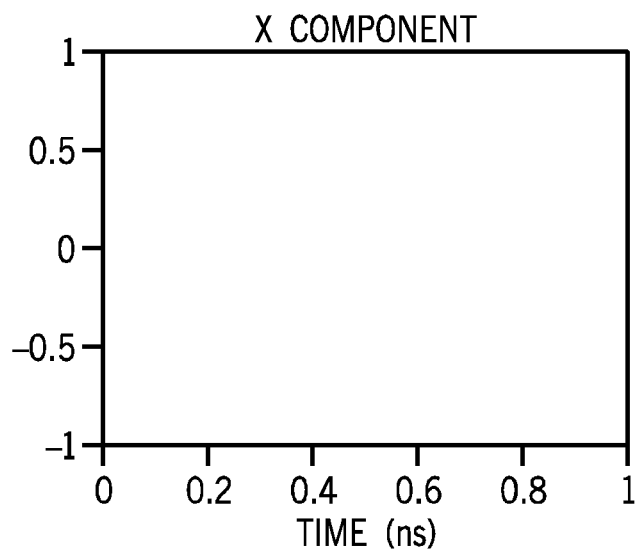
FIGS. 11(a)-11(c) show for conditions ($\beta=5$, $a_j=-0.008$) there is no switching from the P state; only a positive pulse (FIG. 10(a)-10(c)) leads to magnetization switching from the P to the AP state.
Figure 11B:
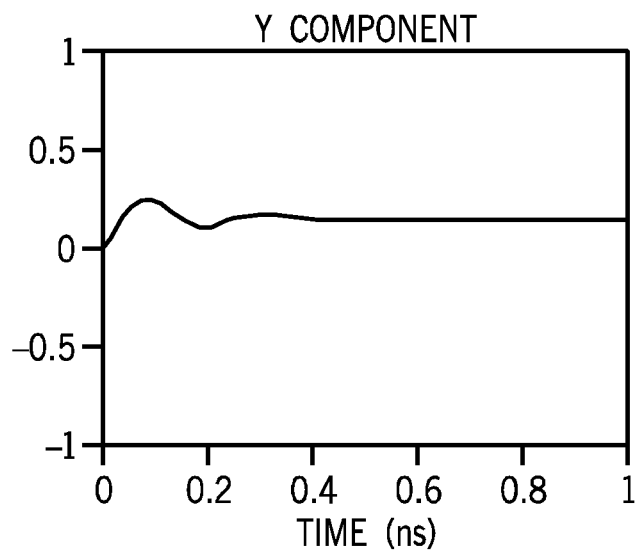
Figure 11C:
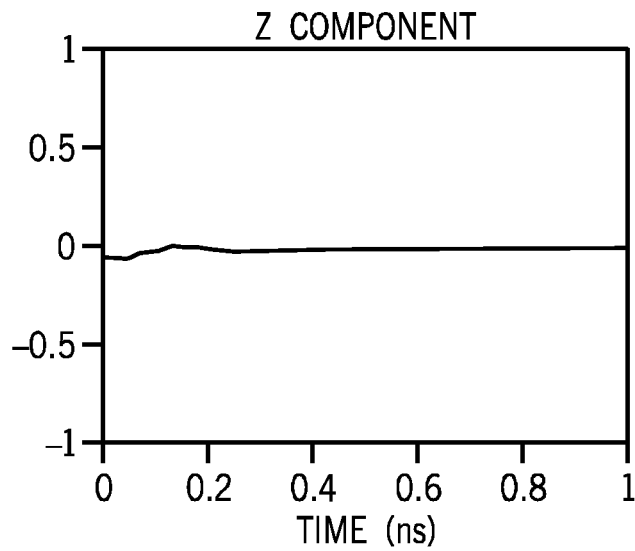
Figure 12A:
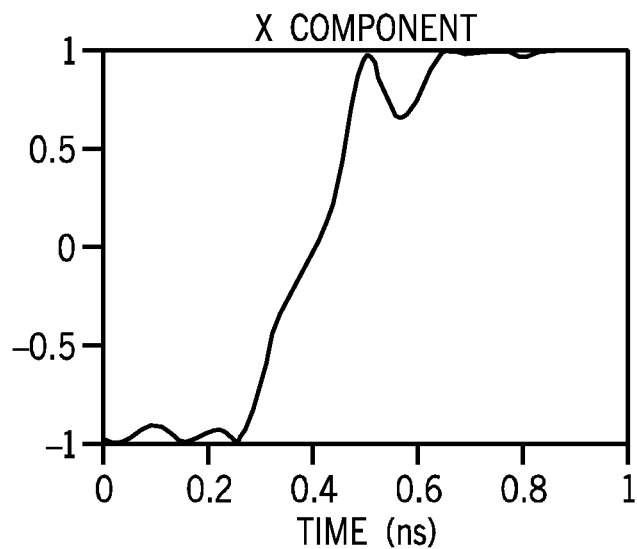
FIGS. 12(a)-12(c) show for conditions ($\beta=5$, $a_j=-0.006$, i.e. negative pulse polarities) there is direct switching from the AP to P state.
Figure 12B:
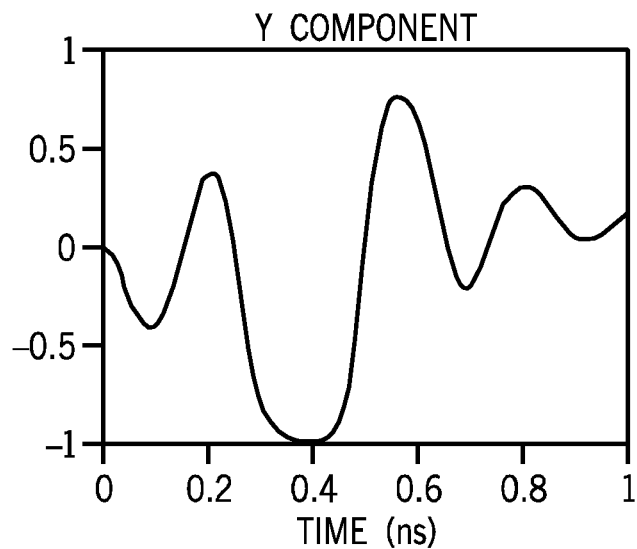
Figure 12C:
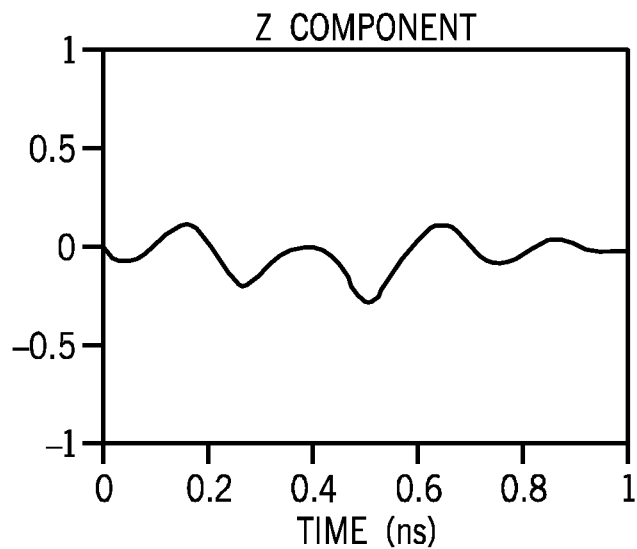
Figure 13A:
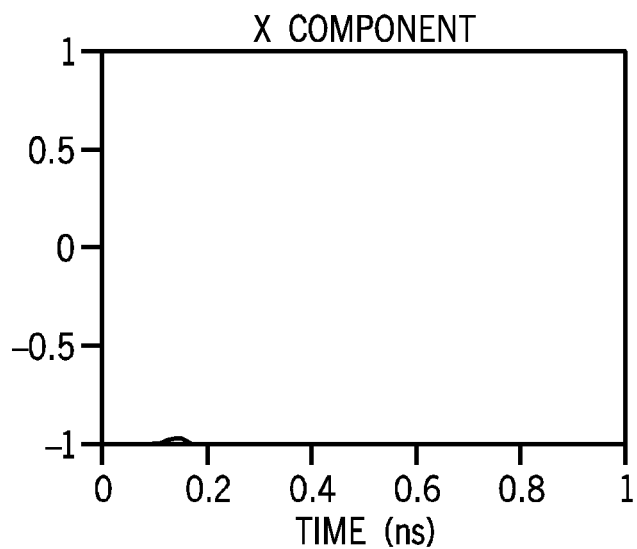
FIGS. 13(a)-13(c) show for conditions ($\beta=5$, $a_j=+0.006$, i.e. positive pulse polarities) there is no switching from the AP to P state, switching from the AP to P state only occurs for negative pulse polarities (FIG. 12(a)-12(c)).
Figure 13B:
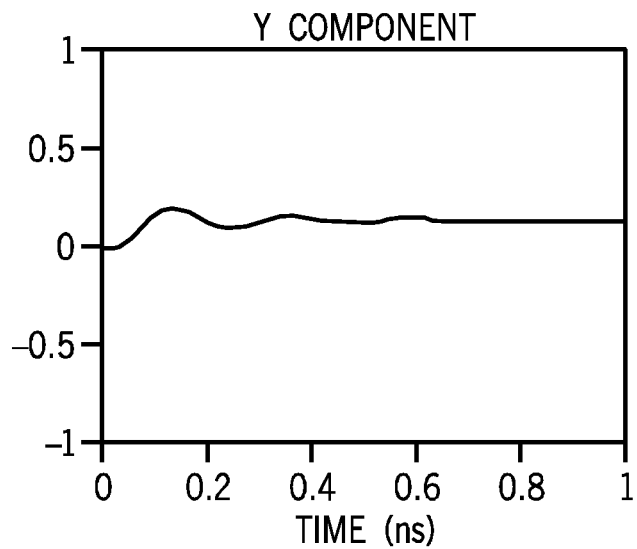
Figure 13C:
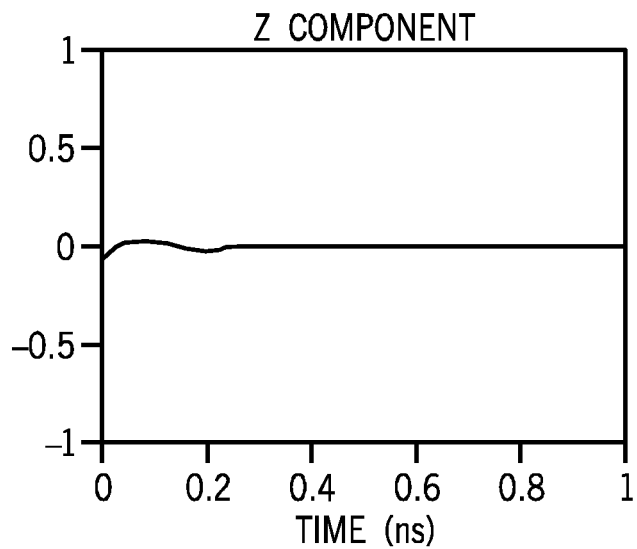

Analysis of this equation shows that the ratio β (beta) is important in controlling the magnetization dynamics. Higher β (greater than 1) results in a range of current pulse amplitudes in which the switching is directly from P to AP for one current polarity and AP to P for the other current polarity. For higher current amplitudes the switching is precessional (toggling from AP to P to AP and continuing, as shown experimentally in FIG. 2). The switching is bipolar in this case, occurring for both current polarities. The device impedance is about 2-4 k Ohms as shown in FIGS. 7(a)-7(c).

For small beta (beta less than or about equal to 1) the range of current pulse amplitudes in which direct switching occurs is reduced. The motion for small β becomes precessional (toggling from AP to P to AP and continuing, as was seen in experiments shown in FIG. 2). When the magnetization motion is precessional higher current amplitudes generally result in higher precession frequencies.

The presence of the polarizer (in all cases cited above) reduces the time needed to set the bit cell state (see FIGS. 6(a)-6(f)) improving device performance, both reducing the switching time and reducing the current (or voltage) amplitude needed for switching. Calculations of the switching dynamics based on model described in Eqn. (2) above show the type of characteristics that can be found in OST-MRAM stacks. The behavior was determined for a thin film nanomagnet with in-plane anisotropy field (along x) of 0.05 T, damping (α=0.01), magnetization density of $\mu M_s$=0.5 T and the magnetization of the reference layer in the +x direction.

EXAMPLE 3

In certain embodiments the reliable writing in which pulse duration is not critical. In such a case, for a memory operation, it may be preferable that the pulse duration not be a critical variable (i.e. the precise pulse duration would not determine the bit cell final state; only the pulse polarity—positive or negative—would be important. In this case, the device is provided with β about equal to or greater than 1. This can be accomplished in a number of ways:

The spin-polarization from the reference layer can be increased by choice of materials for the magnetic tunnel junction and reference layer. For example, CoFeB in contact with MgO has a large spin-polarization. Permalloy (NiFe) in contact with MgO has a lower spin polarization.

The spin-polarization from the polarizing layer can be reduced. This can be accomplished in a number of ways, for example, without limitation:

a. Choice of materials for the composition of the polarizing layer: Co/Ni multilayers have a large spin-polarization. However, Co/Pd or Co/Pt have a much lower spin-polarization. A composite polarizing layer can have an adjustable polarization. For example a multilayer of Co/Ni on Co/Pd or Co/Pt in which the thickness of the Co/Ni is varied (from, say 0.5 to 5 nm) is a means to control the current spin-polarization from the polarizing layer, where the Co/Ni is the layer in closer proximity to the free magnetic layer. A thin layer with large spin-orbit coupling, such as Pt or Pd, could also be placed on the surface of the polarizing layer closer to the free magnetic layer. This would also serve to reduce the current spin-polarization.

b. Alternatively, the nonmagnetic layer between the polarizer and the free layer can be varied to control the spin-polarization of carriers from the polarizing layer (and thus the parameter β). If this layer has a short spin-diffusion length the polarization would be reduced. Including defects in Cu can reduce its spin-polarization (e.g., Ni in Cu or other elements). The Cu can also be an alloy with another element, such as Zn or Ge. There are many possible material combinations that would reduce the spin-polarization from the polarizing layer.

For fast low energy switching it would be preferable to not increase β far beyond 10, because the torque from the perpendicular polarizer sets the switching time and thus the energy required to switch the device (as discussed above).

For fastest write operation: β preferably should be less than one, and the pulse timing needs to a very well-controlled variable. The switching is bipolar and only a single polarity voltage source is needed for device write operations, potentially simplifying the drive circuitry.

Analysis of the model described above (see section [0043]) also shows that the threshold voltage and current for switching can be reduced through a number of means. First, the free layer magnetization density or free layer thickness can be reduced. However, this also is expected to reduce the bit cell stability. So the magnetization density or free layer thickness cannot be made arbitrarily small. Second, the free layer can have a component of perpendicular magnetic anisotropy. This anisotropy would be insufficient in and of itself to reorient the magnetization perpendicular to the layer plane, but would nonetheless be effective in reducing the switching current and voltage. This kind of perpendicular anisotropy is seen in thin (0.5 to 3 nm thick) CoFeB layers in contact with MgO. The switching speed and free layer precession frequency depends on the free layer perpendicular anisotropy. Larger perpendicular anisotropy leads to lower frequency precession, reducing the switching speed. Third, the damping parameter of the free layer can be reduced to reduce the switching current and voltage. This and other means may be used to reduce the switching voltage and current threshold.

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A magnetic device comprising:
   a magnetized polarizing layer;
   a free magnetic layer, the free magnetic layer forming a first electrode and separated from the magnetized polarizing layer by a first non-magnetic metal layer, the free magnetic layer having a magnetization vector having a first stable state and a second stable state;
   a reference layer forming a second electrode and separated from the free-magnetic layer by a second non-magnetic layer, the reference layer having a fixed magnetization vector;

a current source that sources unipolar current through the magnetized polarizing layer, the free magnetic layer and the reference layer, the current source is capable of outputting a first unipolar current pulse of a first duration and having a selected amplitude, the first unipolar current pulse flowing orthogonally through the polarizing layer and having a positive polarity, the current source also capable of outputting a second unipolar current pulse of a second duration and having a selected amplitude, the second unipolar current pulse flowing orthogonally through the polarizing layer and having a negative polarity, and wherein switching of the magnetization vector of the free magnetic layer from the first stable state to the second state is initiated by application of the first unipolar current pulse, and wherein switching of the magnetization vector of the free magnetic layer from the second stable state to the first stable state is initiated by application of the second unipolar current pulse, wherein switching to the second stable state is independent of the first duration of the first unipolar current pulse, and wherein switching to the first stable state is independent of the second duration of the second unipolar current pulse.

2. The magnetic device as in claim 1 wherein the polarizing layer is magnetized perpendicular to the free magnetic layer.

3. The magnetic device as in claim 1, wherein the first duration and the second duration are the same.

4. The magnetic device as defined in claim 1 wherein spin transfer torques associated with the magnetized polarizing layer and an in-plane magnetized form of the reference layer can be described by, $$\frac{d\hat{m}}{dt} = -\gamma\mu_0 \hat{m} \times \vec{H}_{eff} + \alpha \hat{m} \times \frac{d\hat{m}}{dt} + \gamma a_J \hat{m} \times (\hat{m} \times \hat{m}_P) - \beta\gamma a_J \hat{m} \times (\hat{m} \times \hat{m}_R)$$

where m represents the magnetization vector of the free layer magnetization, aJ is a term proportional to current of the unipolar current pulse and spin-polarization of the unipolar current pulse, the third term on the right hand side of this equation being spin transfer torque from the polarizing layer (mP) and the fourth term on the right hand side of the equation being a spin transfer torque from an in-plane magnetized form of the reference layer (mR), and β represents a ratio of magnitude of these spin transfer torques.

5. The magnetic device as defined in claim 4 wherein β>1 provides a range of current pulse amplitudes wherein switching of the magnetic device is directly from parallel to anti-parallel for a first current polarity and anti-parallel to parallel for a second current polarity.

6. The magnetic device as defined in claim 4 wherein the magnetic device switching is precessional and bipolar for both polarities for selected values of β.

7. The magnetic device as defined in claim 4 wherein β less than or about equal to 1 provides precessional switching.

8. The magnetic device as defined in claim 4 wherein the magnetization direction becomes precessional for the β less than or about equal to 1, thereby providing higher precession frequencies for higher current amplitudes.

9. The magnetic device as defined in claim 4 wherein β is selected from the group of about 1 or greater than 1 and pulse polarity and amplitude of the first unipolar current pulse controls a final magnetization state of the free magnetic layer.

10. The magnetic device as defined in claim 4 wherein β is selected from the group of about 1 or greater than 1 and pulse polarity and amplitude of the second unipolar current pulse controls the second stable magnetization state of the free magnetic layer.

11. The magnetic device as defined in claim 9 wherein spin polarization of the reference layer is increased based upon materials of the reference layer and a magnetic tunnel junction layer adjacent thereto.

12. The magnetic device as defined in claim 11 wherein the materials are selected from the group of (a) CoFeB and MgO, (b) NiFe and MgO, and (c) CoFe and MgO.

13. The magnetic device as defined in claim 9 wherein spin polarization from the polarizing layer is reduced based upon a particular composition therefore.

14. The magnetic device as defined in claim 13 wherein the particular composition comprises a Co/Ni multilayer.

15. The magnetic device as defined in claim 14 wherein the multilayer is selected from the group of Co/Ni on Co/Pd, CoNi on Co/Pt.

16. The magnetic device according to claim 1, wherein said first nonmagnetic metal layer is comprised of Cu.

17. The magnetic device according to claim 1, wherein said second non-magnetic layer is comprised of MgO.

* * * * *